United States Patent
Roussy et al.

(10) Patent No.: US 6,909,322 B2
(45) Date of Patent: Jun. 21, 2005

(54) STAGE OF A POWER GENERATOR OF HIGH FREQUENCY CURRENT

(75) Inventors: Georges Roussy, Laxou (FR); Michel Moneuse, Pineuilh (FR); William Benoit, Nancy (FR); Bernard Dichtel, Houdemont (FR); Jean-Marie Jacomino, Rillieux la Pape (FR)

(73) Assignee: Electricite de France Service National, Paris (FR)

( * ) Notice: Subject to any disclaimer, the term of this patent is extended or adjusted under 35 U.S.C. 154(b) by 0 days.

(21) Appl. No.: 10/473,133
(22) PCT Filed: Apr. 11, 2002
(86) PCT No.: PCT/FR02/01264
  § 371 (c)(1),
  (2), (4) Date: Oct. 6, 2003
(87) PCT Pub. No.: WO02/084860
  PCT Pub. Date: Oct. 24, 2002

(65) Prior Publication Data
  US 2004/0108894 A1 Jun. 10, 2004

(30) Foreign Application Priority Data
  Apr. 13, 2001 (FR) .............................. 01 05111

(51) Int. Cl.$^7$ ................................. H03F 3/60
(52) U.S. Cl. .......................... 330/53; 330/78
(58) Field of Search ................ 330/53, 76, 78

(56) References Cited

U.S. PATENT DOCUMENTS

| 2,209,955 | A | | 8/1940 | Black |
| 2,912,570 | A | | 11/1959 | Holzwarth et al. |
| 3,643,179 | A | * | 2/1972 | Jarosz ......................... 331/180 |
| 4,910,476 | A | * | 3/1990 | Benoit et al. .................. 330/76 |
| 5,099,332 | A | * | 3/1992 | Grolleau et al. ............ 348/723 |
| 5,602,515 | A | * | 2/1997 | Held et al. .................. 331/170 |

* cited by examiner

Primary Examiner—Patricia Nguyen
(74) Attorney, Agent, or Firm—Oblon, Spivak, McClelland, Maier & Neustadt, P.C.

(57) ABSTRACT

Output amplifier stage (1) of a high frequency generator (1) with tube (2) operating in class B or C has its output (5) looped back on the input (4) by means of a coaxial line (31) with a length equal to approximately the wave length corresponding to the operating frequency.

The apparent gain of the amplifier stage (1) is thus increased and the output power from an intermediate amplifier (24) can be correspondingly reduced, amplifying a stable signal at the operating frequency.

12 Claims, 4 Drawing Sheets

US 6,909,322 B2

STAGE OF A POWER GENERATOR OF HIGH FREQUENCY CURRENT

TECHNICAL FIELD

This invention relates to the field of high frequency power generators used particularly for heating dielectric materials, for example for polymerization or hot gelling operations during which the material changes from a liquid or paste state to the solid state under the effect of heat. In particular, it relates to the output amplifier stage of such a generator.

TECHNOLOGICAL BACKGROUND

Generators used for industrial applications such as heating dielectric materials have been self-oscillating circuits composed of an amplifier provided with a channel bringing back part of the available output power from the said amplifier to an input of the amplifier. The stability of the output frequency of the amplified wave is achieved by a resonant circuit with a high over voltage coefficient. Considering the increasingly strict requirements about stability of the frequencies produced and tolerated variations with respect to authorized frequencies, it was necessary to design amplifiers amplifying a very stable frequency wave for example produced by a quartz oscillator. This type of generator is then capable of respecting imposed standards about the frequency band to be respected. For information, the following is a list of frequencies authorized in Europe for industrial uses such as heating of dielectric materials:

6.78 MHz within plus or minus 15 kHz, 13.56 MHz within plus or minus 7 kHz, 27.12 MHz within plus or minus 163 kHz, 40.68 MHz within plus or minus 20 kHz, 433.92 MHz within plus or minus 870 kHz.

Generators capable of respecting these frequency stability constraints comprise a quartz controlled oscillator stage supplying one or several frequency divider or multiplier circuits, and possibly a phase loop to guarantee a very stable frequency. The output from the oscillator stage is then input to an intermediate amplification stage composed of one or several amplifier stages and finally an output stage powered by the intermediate amplification stage. The invention relates to this output amplifier stage.

A known amplifier stage consists of a power electronic tube capable of amplifying the received input power by about 20 times. For example, the known stage may be composed of a power triode or a tetrode. In both cases, the electronic tube used operates in class B or C, in other words a current only passes through the tube for a time less than or equal to the half-period of the fundamental signal received as input.

The current produced by the tube excites a resonant circuit with a coaxial output. The over voltage factor of the resonant circuit is usually of the order of ten when a load supplied by the said generator has an impedance equal to the nominal impedance of the generator, usually about 50 ohms. This is the so-called "50 ohms" technique. This technique enables a particularly stable operation of the generator in terms of power and particularly the output frequency. In general, changes to the load impedance, for example due to a change in the state of the material under the effect of temperature, are compensated by providing an adaptor box between the output from the generator output stage and the load, with the function of compensating for the said variations in the impedance of the load applied to the generator.

An example embodiment of a triode amplifier part according to prior art is shown in FIG. 1. This example diagrammatically shows only the tube 2 and the intermediate amplifier 24. The tube 2 is a triode composed of a cathode 4, a grid 3 and an anode 5. An input 25 to the tube 2 connected to the cathode 4 is coupled to an output 23 from the intermediate amplifier 24. This intermediate amplifier has an input 29 coupled to an oscillator not shown that outputs a signal at the required frequency.

Operation and orders of magnitude are described below:

The tube may for example have a power gain of 20. To obtain an output power of 50 kW, a power of 2.5 kW has to be applied on its input 25. This power of 2.5 kW must be output by the intermediate amplifier 24. The power available at the output from the quartz oscillator (not shown) is 5 Watts, and the intermediate amplifier must have a very high power gain. Thus, it can be seen that according to prior art, an intermediate amplifier is required with a power gain of about 500 and outputting a power of about 2.5 kW.

This difficulty is usually avoided in prior art by using triode generators to produce output powers up to 30 kW. Tetrodes are preferred for higher powers.

As mentioned above, a triode amplifier with a power gain of the order of 20 is used. Thus, the intermediate stage before the amplifier output stage must output, for example 1 kW, for a generator with an output power of 20 kW. An intermediate amplifier capable of producing a power of the order of one kW is the maximum that is achievable with routinely used transistors such that this type of amplifier can be produced at a reasonable price.

For higher power generators, for example as described with reference to FIG. 1, the difficulties in making an intermediate stage and consequently the price increase quickly. The gain of triode amplifiers remains constant in class B and C; therefore the intermediate stage must output a power proportional to the required output power. An intermediate power amplifier outputting a high power may be obtained by replacing the transistors by a tube. This replacement is expensive firstly due to the price of the tube, and secondly due to the need for an additional high voltage power supply to operate the said tube. Under these conditions, rather than using such an intermediate stage with a tube, it is preferred to use a tetrode to build high power high frequency generators, because a tetrode can have a power gain between 50 and 100. Thus, although the tube itself is more expensive and it also requires an additional electronic power supply to polarize the additional screen grid, the price of the generator remains lower due to the resulting simplification of the intermediate amplifier. The main difficulty with generators using a tetrode is due to the need to neutrodine the tube by a suitable counter-reaction circuit. This circuit is difficult to make. It must be placed very close to the tube and it is difficult to adjust, particularly because it is sensitive particularly to thermal variations induced by the tube. Therefore, there is a need for an easy-to-make generator output amplifier outputting a high frequency high power current that does not require an intermediate amplifier outputting a relatively high power.

BRIEF DESCRIPTION OF THE INVENTION

The invention proposes to make a positive reaction between the anode and the cathode of the triode or the tetrode used to make the terminal stage. This reaction is achieved using a wide band line with distributed constants or distributed local impedances, for example a coaxial line. Surprisingly, it was found possible to correct an amplifier operating in class B or C, in other words with non-linear operation, with a line, as if it were an amplifier operating under linear conditions. Since part of the output power is brought back to the amplifier input, the output power is increased by a factor of five to ten, since the triode or the tetrode keeps its internal gain.

In summary, the invention relates to an amplifier output stage from a high frequency current generator corresponding to a wave length λ designed to power a load impedance, comprising a triode or a tetrode polarized to operate in class B or C, the triode or the tetrode being provided with a cathode, a grid and an anode, the grid having a DC voltage similar to the voltage in a ground circuit, the amplifier being characterized in that the anode of the triode or the tetrode is coupled in return to the cathode so as to cause a positive reaction through a wide band line, with distributed constants or distributed local impedances with an input coupled to the anode and an output coupled to the cathode.

It is desirable that the return wave should be in phase or slightly out of phase with the input wave, so that the reaction is genuinely positive. Under these conditions, it is preferable to use a line with an electric length close to the wavelength λ of the frequency output by the generator. The anode line input can be coupled capacitively or inductively, for example using a loop.

BRIEF DESCRIPTION OF THE DRAWINGS

Other advantages and detailed embodiments of the invention will be described below with reference to attached drawings in which.

All elements with the same function have the same reference number in all drawings.

DESCRIPTION OF EMBODIMENTS

Figure 2:
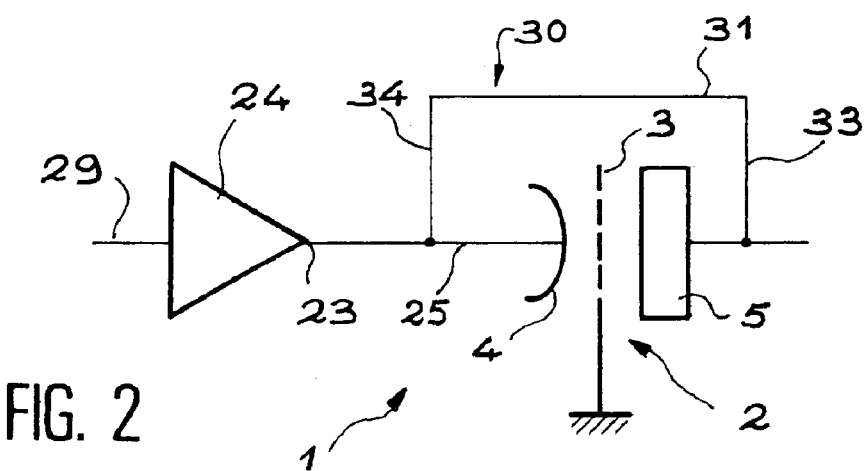
FIG. 2 is a general diagram of an amplifier output stage of a high frequency current generator according to the invention.

FIG. 2 shows a circuit for a high frequency amplifier in which the tube used is a triode 2 operating in class B or C. The triode 2 has a grid 3, a cathode 4 and an anode 5. A return loop 30, for example composed of a coaxial line 31 with an electrical length equal to approximately the wave length λ corresponding to the output frequency, has an input 33 coupled to the anode 5 and an output 34 coupled downstream of amplifier 24 on the output side of the amplifier 24 and upstream of the input side of cathode 4. This loop 30 brings back part of the available output from the anode 5 of the tube 2, to the output side of the intermediate amplifier 24.

Figure 1:
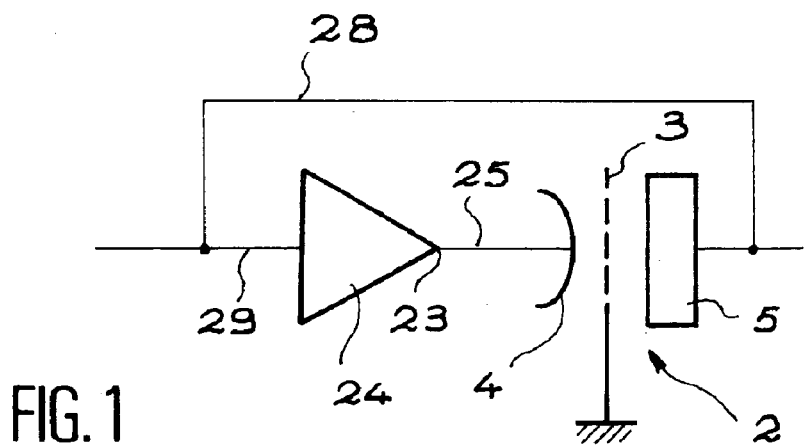
FIG. 1 described above, is a diagram showing an embodiment of an amplifier output stage of a high frequency current generator according to prior art.

We will now describe the advantage of such an assembly by comparison with the circuit shown in FIG. 1, using the same orders of magnitude.

A power of 5 watts output from a stable oscillator, not shown, is applied to the input 29 of the intermediate amplifier 24, as in prior art. The gain of this amplifier 24 is of the order of 100 such that the available output power at the output 23 of this amplifier 24 is of the order of 500 watts. Consequently, the power that can be fed back to this level without losing the benefit of the frequency stabilization due to the oscillator, is of the order of 2 kW. The power at the input 25 to the tube is then of the order of 2.5 kW. With an amplification of 20 due to triode 2, the output power is 50 kilowatts. Thus, the intermediate amplifier 24 that only outputs a power very much less than one kilowatt can easily be made with inexpensive components, and the power amplifier can be made using a triode.

Figure 3:
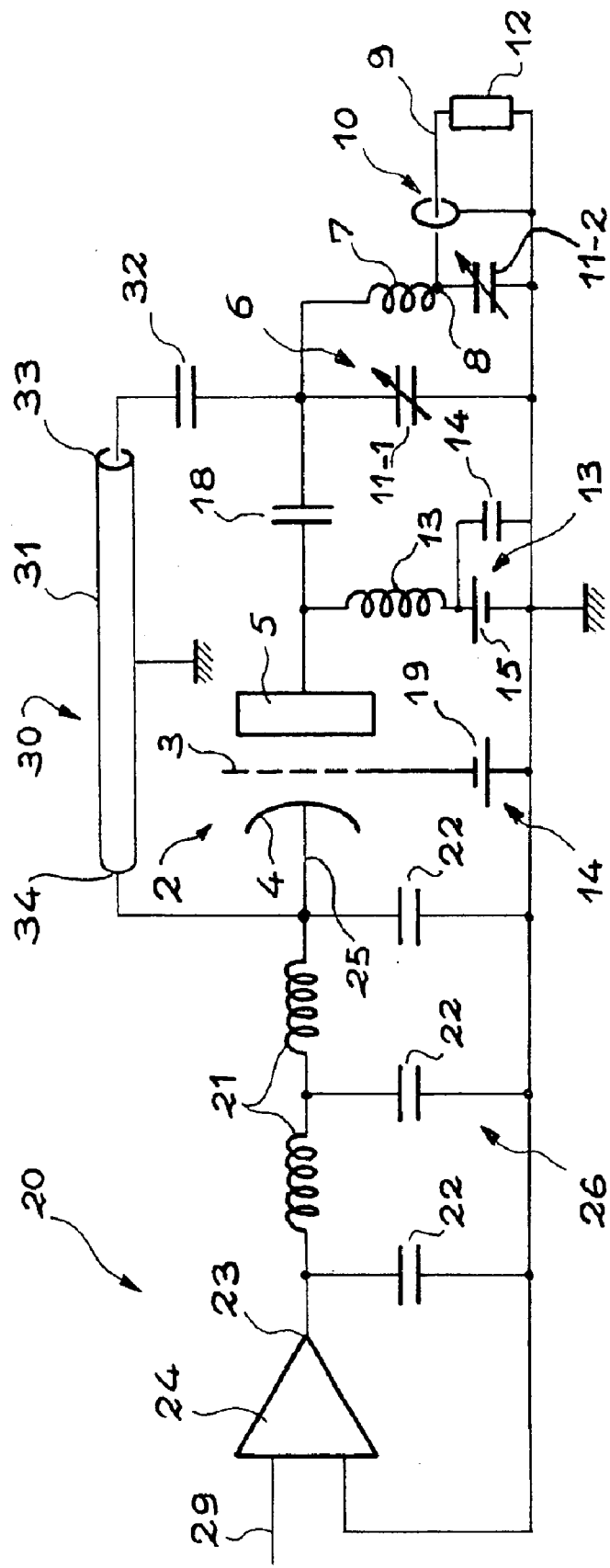
FIG. 3 is a diagram representing an embodiment of the invention.

We will now describe an embodiment of the invention with more details with reference to FIG. 3.

A tube input circuit 20 comprises a filter and an impedance matching circuit 26 placed between the output 23 and the input 25 of the tube 2 connected to the cathode 4, in addition to the intermediate amplifier 24 with an output 23, in a known manner. The filter and impedance matching circuit 26 may for example be composed of a set of inductances 21 and capacitances 22 connected together as shown in FIG. 3, to make a π circuit, in a known manner. The filter and impedance matching circuit 26 is a band pass circuit centered on the frequency to be obtained. In a manner also known in itself, the anode 5 of the tube 2 is connected through a connection capacitance 18 to a resonant output circuit 6 composed of a variable two-part capacitance, the two parts 11-1, 11-2 being connected in parallel as shown in FIG. 3, and an inductance 7. Also in a manner known in itself, one end 8 of the inductance 7 is connected to a central conductor 9 of a coaxial line 10 called the output line. The capacitance 11-2 is connected between the end 8 and the ground. It participates in adjusting the value of the amplifier output impedance to 50 ohms. The coaxial output line is connected on a load 12 connected between the central conductor 9 and the ground. The DC anode polarization power supply is output through a filter circuit, which in the example shown is materialized by a shock inductance 13 connected between the anode and a high voltage DC power supply 15 and a capacitance 14 connected in series with the shock inductance 13. The series circuit composed of the shock inductance 13 and the capacitance 14 is connected between the anode 5 and the ground as shown in FIG. 3. This figure does not show a power supply circuit to a cathode heating filament and a filter for this circuit to isolate it from the high frequency input.

Grid 3 is connected to the negative terminal of a DC power supply 19, the positive terminal of which is connected to the ground. The grid is thus polarized negatively.

According to the invention, the return from anode 5 is coupled through a circuit 30 to cathode 4. The reaction circuit 30 is composed of a connecting capacitance 32 coupled between the anode 5 and an input 33 to a coaxial line 31. Alternately, the coupling may also be made by a magnetic loop. The output 34 from the coaxial line is connected to the cathode 4. Preferably, the coaxial line 31 is equipped with means of adjusting its length, to compensate for variations in the impedance of the generator load 12. For example, it may be a sliding line, a first part of the line having a tube-shaped core into which a core from a second part of the line is free to slide. It may also be a line in two parts, a first part with a fixed length less than the wavelength λ of the fundamental frequency being provided with a connection to hold a second part of the line that can be chosen from among different lengths of line segments by carrying out a series of tests. In the embodiment shown in FIG. 3, the output 34 from the coaxial line 31 is connected to the input 25 of tube 2 on the output side of the filter and impedance matching circuit 26. Naturally, this coupling may also be made to the output 23 from the intermediate amplifier 24 on the input side of the filter and impedance matching circuit 26. Operation is described below.

The reaction circuit 30 composed of a coaxial line 31 or a distributed constants line brings back part of the output power from tube 2 to the input 25 of this tube, either directly or through the filter circuit 26. The fraction of the input power brought back in depends on the geometry of the input coupling means that will be described later, and the value of the coupling capacitance 32 or the geometry of the magnetic coupling loop.

It might be thought that the coaxial line acts as an ordinary reaction circuit of a linear amplifier.

This is not the case, since in the case of the invention, the amplifier operates in class B or C. In such an amplifier, the electrical signal at the input (cathode) is not sinusoidal, because the tube operates in pulse mode. This pulse mode is equivalent to a fundamental mode at the pulse repetition frequency, which is additional to harmonics at multiple frequencies of the fundamental frequency. It follows that the coaxial line does not carry a sinusoidal alternating signal, but instead it carries an alternating signal with multiple harmonics of the fundamental frequency. The coaxial line is a circuit with a very wide pass band. If the electrical length of the coaxial line is sufficiently close to the wave length λ of the fundamental frequency, its length will be equal to twice the wavelength of the frequency of harmonic 2, three times the wave length of the frequency of harmonic 3, and so on. The signals from all harmonics present on the anode are transmitted in phase return, with the same power ratio, in other words all identical at the input circuit. It follows that the reaction affects harmonics in the same manner. The global operation of the amplifier consisting of the tube 2 is corrected in class B or C. If a reaction circuit with local constants was chosen using inductances and capacitances as might have been suggested by an expert in the subject, it would have been difficult if not impossible to adjust it so that it transmits all harmonics uniformly, remaining stable, without a phase shift between the different harmonics, and such that the reaction would be efficient on the class B or C amplifier. Thus, the invention is significantly different from a reaction circuit like those described for example in the book by Pieter L. D. ABRIE entitled "Design of RF and microwave Amplifiers and Oscillators"—Artech House— pages 431–435. These circuits are designed to control the gain of wide band transistor amplifiers, such that the gain of the amplifier remains constant despite large variations in the signal to be amplified at the amplifier input. The circuit described in this book is based on transformers. A transformer rarely has a wide enough pass band to enable transmission of a signal at a fundamental frequency and several of its harmonics without a phase shift, although it becomes possible as described above, for example with a coaxial line with a length equal to the wave length corresponding to the fundamental frequency.

Figure 4:
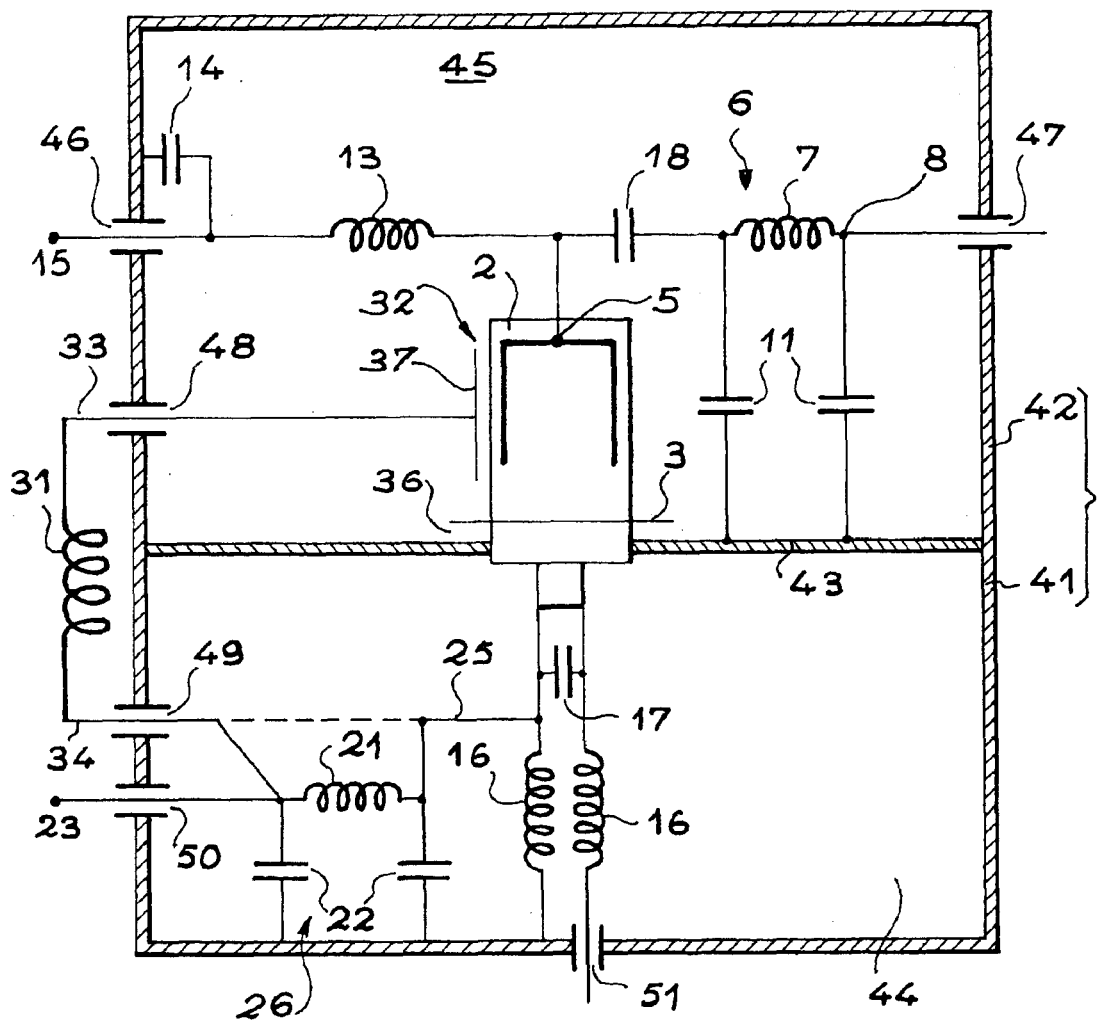
FIG. 4 shows a diagram according to the invention in which the physical characteristics are shown.

FIG. 4 describes how the circuit according to the invention is made physically.

Tube 2 and its external circuits associated with the tube such as the filter and impedance matching circuit 26 coupled to the cathode 4, the resonant output circuit 6 coupled to the anode are included in a chamber 40. The chamber 40 is composed of two metallic half-shells, a first half-shell 41 and a second half-shell 42. The two half-shells 41, 42 are joined together at a ground plane 43 consisting of a conducting plane, for example a metal sheet. The ground plane 43 separates the space enclosed by the chamber 40 between a cathode space 44 and an anode space 45. The cathode space 44 contains the part of the tube 2 containing the cathode and the cathode circuits, particularly the high frequency input filter circuit 26, a power supply circuit for a heating filament for the cathode 4 composed of shock inductances 16 and a capacitance 17. The ground plane 43 is located under a grid plane 3 of the tube, such that the grid plane 3 forms a capacitance 36 with the ground plane 43. As shown in FIG. 3, the grid plane 3 is connected to a DC power supply 19 such that the grid 3 is polarized negatively with respect to the ground plane 43. In FIG. 3, the capacitance 36 formed between the grid plane 3 and the ground plane 43 is not shown since it is not a specific component. The anode space 45 contains the grid plane 3, and also the part of the tube 2 containing the anode, the resonant circuit 6, the connecting capacitance 18, the anode DC power supply filter circuit composed of the shock inductance 13 and the capacitance 14. The coupling capacitance 32 of the input 33 to the reaction line 31 is composed of a plate 37 forming a capacitive link with the anode 5. It could also be a magnetic loop forming an inductive link with inductance 7. In both cases, the coupling value can be adjusted by modifying the position of the coupling element. Consequently, the coupling element will preferably be installed mechanically free to move with fixing means to immobilize it in an optimum adjustment position. The means for enabling mobility and immobilization are known in themselves. For example, it could be a rail with locking means enabling a translation movement, or a spindle with tightening means allowing a rotation or even a combination of means allowing rotation and translation. In the case of a rotary movement, the plate 37 or the loop is installed on a rotary support about an axis, for example coplanar with the plate or the loop. Crossings 46, 47, 48 in the half-shell 42 of the chamber of the anode space 45 enable connection to the anode high voltage 15, the impedance of the load 12 and the input 33 of the return line 31 respectively. Similarly, the crossings 49, 50, 51 through the casing 41 around the cathode space 44 are used for connection with the output 23 from the intermediate amplifier 24, with the output 34 from the reaction line 31, and with a power supply not shown for the cathode heating filament, respectively. In the example shown with reference to FIGS. 3 and 4, the output 34 of the line 31 is connected on the input side of the filter and impedance matching circuit 26. The dashed line on FIG. 4 shows how the output 34 can also be connected directly to the cathode input 25.

In the preferred embodiments of the invention (FIGS. 5, 6 and 7), a "combiner" circuit 52, known in itself, with two inputs 53 and 54 and an output 55 is used to determined the sum of the power present at the output 23 from the intermediate amplifier 24 and the power brought in by the output 34 from the reaction line 31. The combiner circuit 52 is a 3 dB directive coupler for which a fourth branch, not shown, is terminated by a matched load. The "combiner" circuit 52 enables better control over impedances as a function of which this sum will be made. It could be a typical commercially available combiner in which case its nominal output impedance would be 50 ohms, or it could be a dedicated combiner for which the output impedance is designed to be matched to the input impedance of tube 2.

Figure 5:
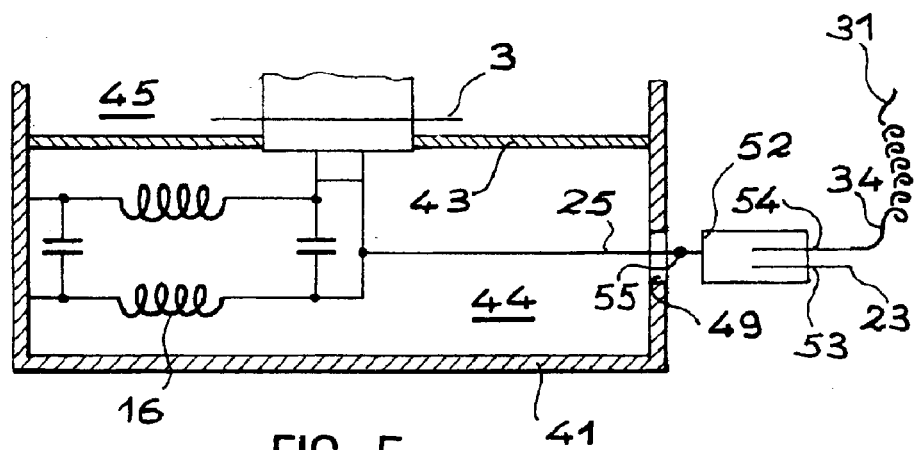
FIG. 5 shows a combiner circuit to bring part of the amplifier output power to the input.

As shown physically in FIG. 5, the "combiner" circuit 52 may have its output 55 connected directly to the input 25 of the cathode through the crossing of the half-shell 41. The input 53 of the "combiner" circuit 52 is connected to the output 34 from line 31 and the input 54 is connected to the output 23 of the intermediate amplifier 24. In this embodiment, there is no filter and impedance matching circuit 26.

Figure 6:
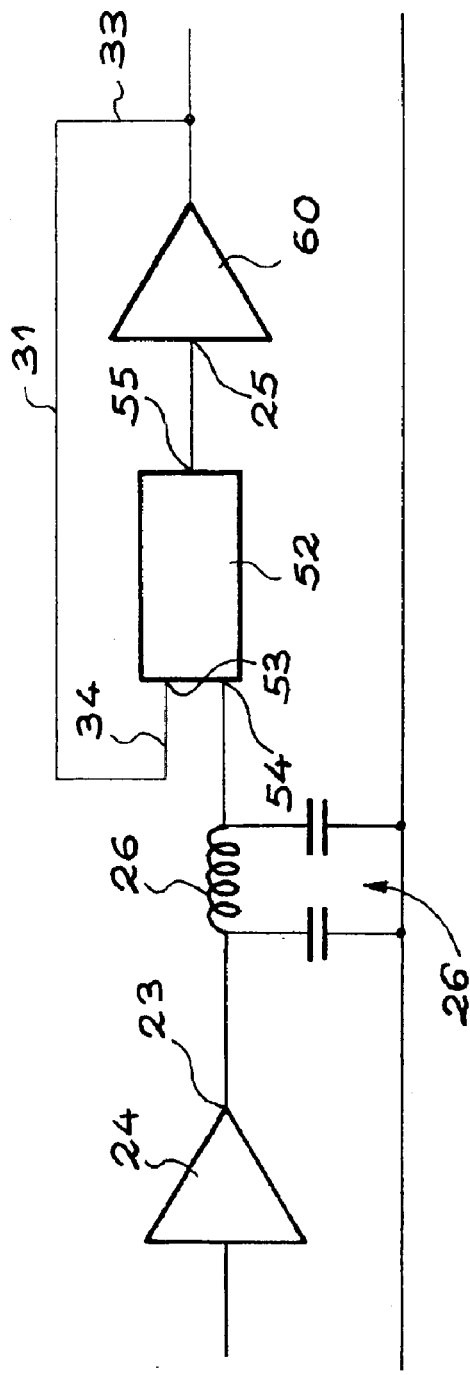
FIGS. 6 and 7 show two implantation modes of the combiner circuit.
Figure 7:
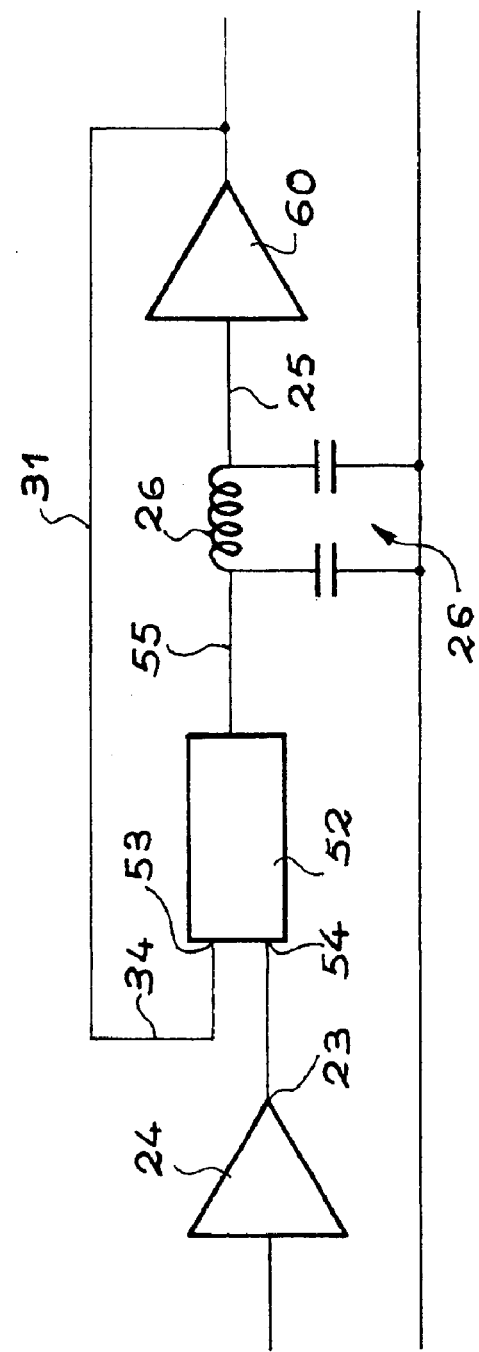

Circuit 1 comprises the filter and impedance matching circuit 26 in the variant embodiments shown diagrammatically in FIGS. 6 and 7. In FIGS. 6 and 7, the amplifier formed by tube 2 is shown conventionally by an amplifier 60.

In the embodiment shown in FIG. 6, the filter and impedance matching circuit 26 is located on the input side of the combiner 52 such that the feedback power present at the input 53 of the combiner 52 is applied to input 25 of the amplifier 60 without being filtered by the circuit 26, and the power of the intermediate amplifier 24 is applied on the input 54 after it has been filtered by the filter and impedance matching circuit 26, this circuit 26 being on the input side of the input 54 and on the output side of the intermediate amplifier 24.

In the embodiment shown in FIG. 7, the filter and impedance matching circuit 26 is on the output side of the output 55 of the combiner 52 such that the feedback power present at the input 53 of the combiner 52 and the power of the intermediate amplifier 24 present on the input 54, are applied to the input 25 of the amplifier 60, after they both have been filtered by the filter and impedance matching circuit 26.

The circuits shown in FIGS. 6 and 7 are almost identical ; however, the combiner circuit 52 does not resist mismatches very well. As mentioned above, these circuits, as they are sold in the shops, are designed to operate at an output impedance of 50 ohms. The assembly shown in FIG. 7 provides a means of matching the input impedance of the amplifier 60, such that the impedance seen at the combiner 52 end is 50 ohms. If a commercially available combiner is used, the circuits shown in FIGS. 5 and 6 are not as stable as the circuits shown in FIG. 7.

The discussion about the advantages of the matching circuit 26 used with the combiner only considered impedances at the nominal operating frequency of the device 1 according to the invention. Note that impedances at harmonic frequencies of the nominal frequency are also involved, since the harmonics are present because the tube 2 is operating in class B or C. Settings should be made particularly for the output coupling value from tube 2, and possibly of the return coaxial line around the wavelength at the nominal value of the operating frequency such that the amplifier does not oscillate at low power, or for example when the value of the load impedance varies due to a state change of the material being treated.

What is claimed is:

1. Output amplifier stage (1) of a generator generating a high frequency current with wave length λ, designed to power a load impedance (12), comprising a triode or a tetrode (2) polarized to operate in class B or C, the triode or the tetrode (2) being provided with a cathode (4), and an anode (5), characterized in that the anode (5) of the triode or the tetrode (2) is coupled back to the cathode (4) so as to cause a positive reaction through a wide band line (31), with distributed constants or distributed local impedances with an input (33) coupled to the anode (5) and an output coupled to the cathode (4).

2. High frequency generator output amplifier stage (1) according to claim 1, characterized in that the line (31) with distributed constants is a coaxial line.

3. High frequency generator output amplifier stage (1) according to claim 2, characterized in that the coaxial line is equipped with means of adjusting its length.

4. High frequency generator output amplifier stage (1) according to claim 1, characterized in that the means of coupling the output (34) from the line (31) with distributed constants and the anode (5) comprise a combiner circuit (52) with two inputs (53, 54) and an output (55), one of the inputs (53) being coupled to the output (34) from line (31) with distributed constants, the other input (54) being coupled to an output (23) from an intermediate amplifier (24) and the output (55) from the combiner circuit (52) being coupled to the cathode (4).

5. High frequency generator output amplifier stage (1) according to claim 4, characterized in that the coupling means between the output (34) from the line (31) with distributed constants and the anode (5) also comprise a filter and impedance matching circuit (26) connected on the input side or on the output side of the combiner circuit (52).

6. High frequency generator output amplifier stage (1) according to claim 1, characterized in that the input (33) of the line (31) with distributed constants is coupled to the anode (5) through a magnetic loop or a capacitive plate (32).

7. High frequency generator output amplifier stage (1) according to claim 6, characterized in that the loop or the plate (32) is mounted so as to enable mobility and immobilization.

8. High frequency generator output amplifier stage (1) according to claim 7, characterized in that the loop or the plate (32) is free to rotate about an axis so as to adjust the coupling value of the input of line (31) and the anode (5).

9. High frequency generator output amplifier stage (1) according to claim 1, characterized in that the electric length of the line with distributed constants or with distributed localized impedances is close to the generator operating wavelength λ.

10. High frequency generator output amplifier stage (1) according to claim 2, characterized in that the means of coupling the output (34) from the line (31) with distributed constants and the anode (5) comprise a combiner circuit (52) with two inputs (53, 54) and an output (55), one of the inputs (53) being coupled to the output (34) from line (31) with distributed constants, the other input (54) being coupled to an output (23) from an intermediate amplifier (24) and the output (55) from the combiner circuit (52) being coupled to the cathode (4).

11. High frequency generator output amplifier stage (1) according to claim 3, characterized in that the means of coupling the output (34) from the line (31) with distributed constants and the anode (5) comprise a combiner circuit (52) with two inputs (53, 54) and an output (55), one of the inputs (53) being coupled to the output (34) from line (31) with distributed constants, the other input (54) being coupled to an output (23) from an intermediate amplifier (24) and the output (55) from the combiner circuit (52) being coupled to the cathode (4).

12. High frequency generator characterized in that it comprises an output amplifier stage (1) according to any one of the preceding claims.

* * * * *